United States Patent

Arakawa et al.

[11] Patent Number: 6,131,721
[45] Date of Patent: Oct. 17, 2000

[54] LEAD FRAME TRANSPORTING APPARATUS

[75] Inventors: Isao Arakawa; Tatsuya Urata; Shinichi Matsumura, all of Kumamoto, Japan

[73] Assignee: Mitsubishi Denki Kabushiki Kaisha, Tokyo, Japan

[21] Appl. No.: 09/080,724

[22] Filed: May 21, 1998

[30] Foreign Application Priority Data

Dec. 2, 1997 [JP] Japan ................................. 9-332092

[51] Int. Cl.⁷ ................................................ B65G 25/00
[52] U.S. Cl. ................................. 198/468.3; 198/468.4
[58] Field of Search ......................... 198/468.2, 468.3, 198/468.4, 750.11, 750.12; 294/65 R; 414/900

[56] References Cited

U.S. PATENT DOCUMENTS

| | | | |
|---|---|---|---|
| 3,920,128 | 11/1975 | Baker | 198/468.4 |
| 4,775,290 | 10/1988 | Brown et al. | 294/65 |
| 4,927,321 | 5/1990 | Lucas | 414/900 |
| 5,177,434 | 1/1993 | Suzuki et al. | 198/468.3 |
| 5,330,043 | 7/1994 | Stuckey | 198/468.4 |
| 5,685,589 | 11/1997 | Kikuchi et al. | 414/900 |
| 5,864,943 | 2/1999 | Arakawa et al. | 294/65 |
| 5,931,279 | 8/1999 | Pedrotto et al. | 198/468.3 |
| 5,957,654 | 9/1999 | Choi et al. | 294/65 |

FOREIGN PATENT DOCUMENTS

| | | |
|---|---|---|
| 7206211 | 8/1995 | Japan . |
| 899733 | 4/1996 | Japan . |

*Primary Examiner*—Douglas Hess
*Attorney, Agent, or Firm*—Leydig, Voit & Mayer, Ltd.

[57] ABSTRACT

In a lead frame transporting apparatus for transporting lead frames on which package portions are located, slide shafts are included on a frame conveyor plate. Pad support members are slidably mounted on the slide shafts. Suction pads for holding the package portions with suction are mounted on respective pad support members. The sliding of the slide members is limited by a slide limiting device on the frame conveyor plate. The slide limit of the pad support members is removed by a pad moving mechanism and the pad support members are moved along the slide shafts. Information regarding the lead frames is input into a controlling section so that the pad moving mechanism can be controlled and the positions of all the pad support members automatically adjusted.

3 Claims, 15 Drawing Sheets

LEAD FRAME TRANSPORTING APPARATUS

BACKGROUND OF THE INVENTION

1. Field of the Invention

The present invention relates to a lead frame transporting apparatus used in a semiconductor device manufacturing process for transporting molded lead frames by using suction on the package portions thereof.

2. Description of the Related Art

FIG. 13 is a front view of an essential portion showing one example of a conventional lead frame transporting apparatus, FIG. 14 is a plan view of the apparatus shown in FIG. 13 and FIG. 15 is a side elevational view showing the apparatus shown in FIG. 13. In these drawings, a frame conveyor plate 1 is moved vertically by a lifting air cylinder 2 and at the same time moved horizontally in FIG. 13 by an air slide mechanism 3. A pair of first slide shafts 5 and a pair of second slide shafts 6 are mounted through shaft support plates 4 on the frame conveyor plate 1, respectively.

Five pad support members 7 are slidably mounted on each of the first and second slide shafts 5 and 6. Suction pads 9 for sucking the package portions 8a of the lead frames 8 are mounted on the pad support members 7, respectively. The pad support members 7 are fixed to the slide shafts 5 and 6 in the axial direction by fastening screws 10.

In the thus constructed conventional lead frame transporting apparatus, when the type of lead frame 8 is changed and the number and position of the package portions 8a are changed, it is necessary to refasten the fastening screws 10 by loosening the fastening screws 10 one by one and displacing the positions of the pad support members 7. Thus the process of setting-up the change in accordance with the type of lead frames 8 requires a large amount of work and a long period of time.

SUMMARY OF THE INVENTION

In order to overcome the above-noted defects, an object of the present invention is to provide a lead frame transporting apparatus where a positional adjustment of suction pads may be readily performed in accordance with the type of lead frames in a short period of time.

To this end, according to one aspect of the present invention, there is provided a lead frame transporting apparatus for transporting lead frames on which a plurality of package portions are formed, comprising: a frame conveyor plate; a driving means for moving the frame conveyor plate vertically and horizontally; slide shafts provided on the frame conveyor plate; a plurality of pad support members mounted slidably on the slide shafts, respectively; a plurality of suction pads mounted on the pad support members, respectively, for holding the package portions with suction; a slide limiting means provided on the frame conveyor plate for limiting a slide of the pad support members; a pad moving mechanism for releasing the limit of the slide limiting means and moving the pad support members along the slide shafts; and a controlling section for controlling the pad moving mechanism according to lead frame information input therein to automatically adjust positions of all the pad support members.

According to another aspect of the present invention, there is provided a lead frame transporting apparatus for transporting lead frames on which a plurality of package portions are formed, comprising: frame conveyor plate; a driving means for moving the frame conveyor plate vertically and horizontally; slide shafts provided on the frame conveyor plate; a plurality of pad support members mounted slidably on the slide shafts, respectively; a plurality of suction pads mounted on the pad support members, respectively, for holding the package portions with suctions; and a plurality of positioning plates in which a plurality of grooves into which a part of the pad support members are to be inserted are formed at different positions and selectively mounted on the frame conveyor plate for positioning the pad support members in an axial direction of the slide shafts.

DETAILED DESCRIPTION OF THE PREFERRED EMBODIMENTS

An embodiment of the present invention will now be described with reference to the accompanying drawings.

First Embodiment

Figure 1:
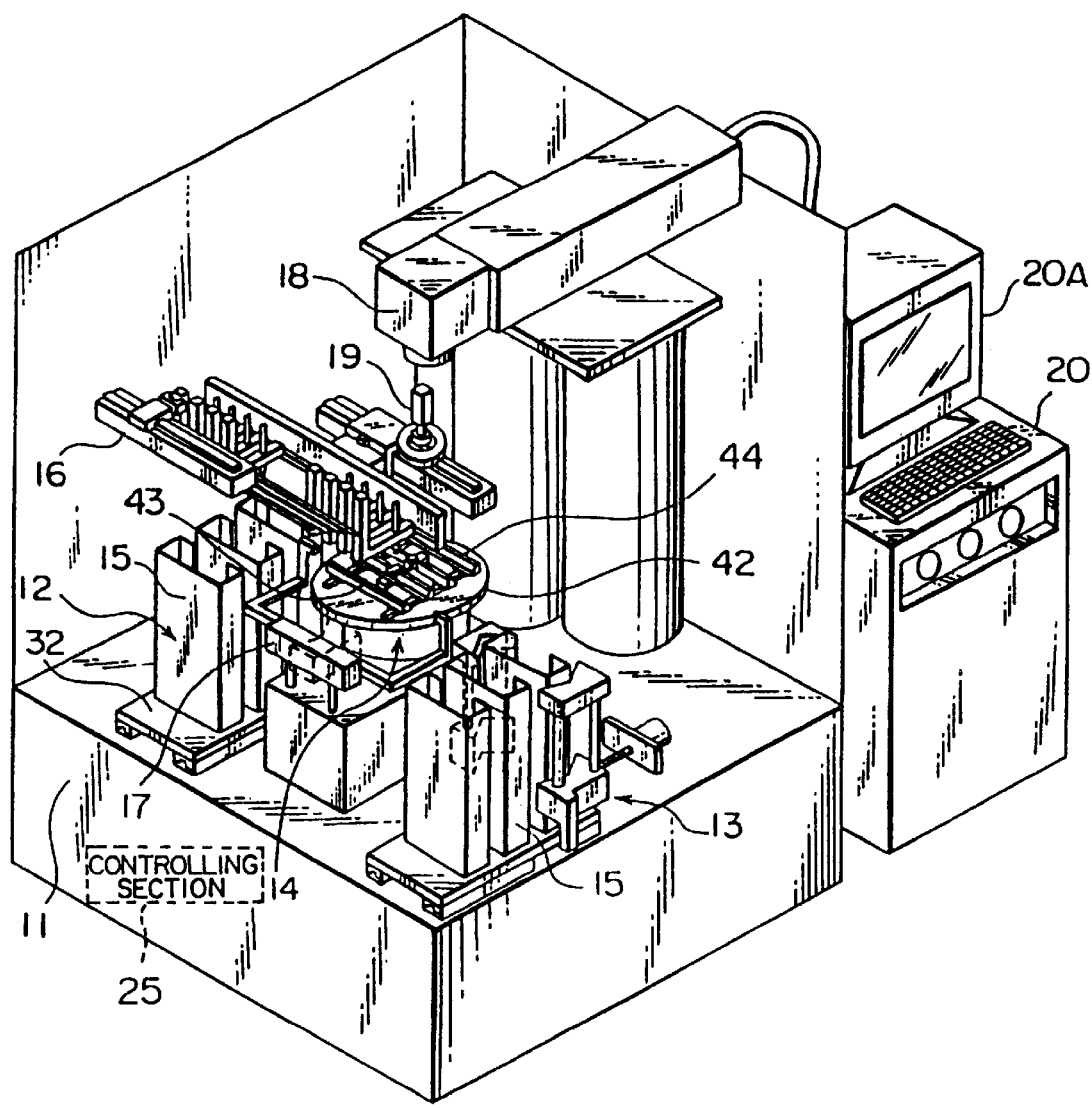
FIG. 1 is a perspective view showing a laser marking apparatus having a lead frame transporting apparatus in accordance with a first embodiment of the present invention.
Figure 2:
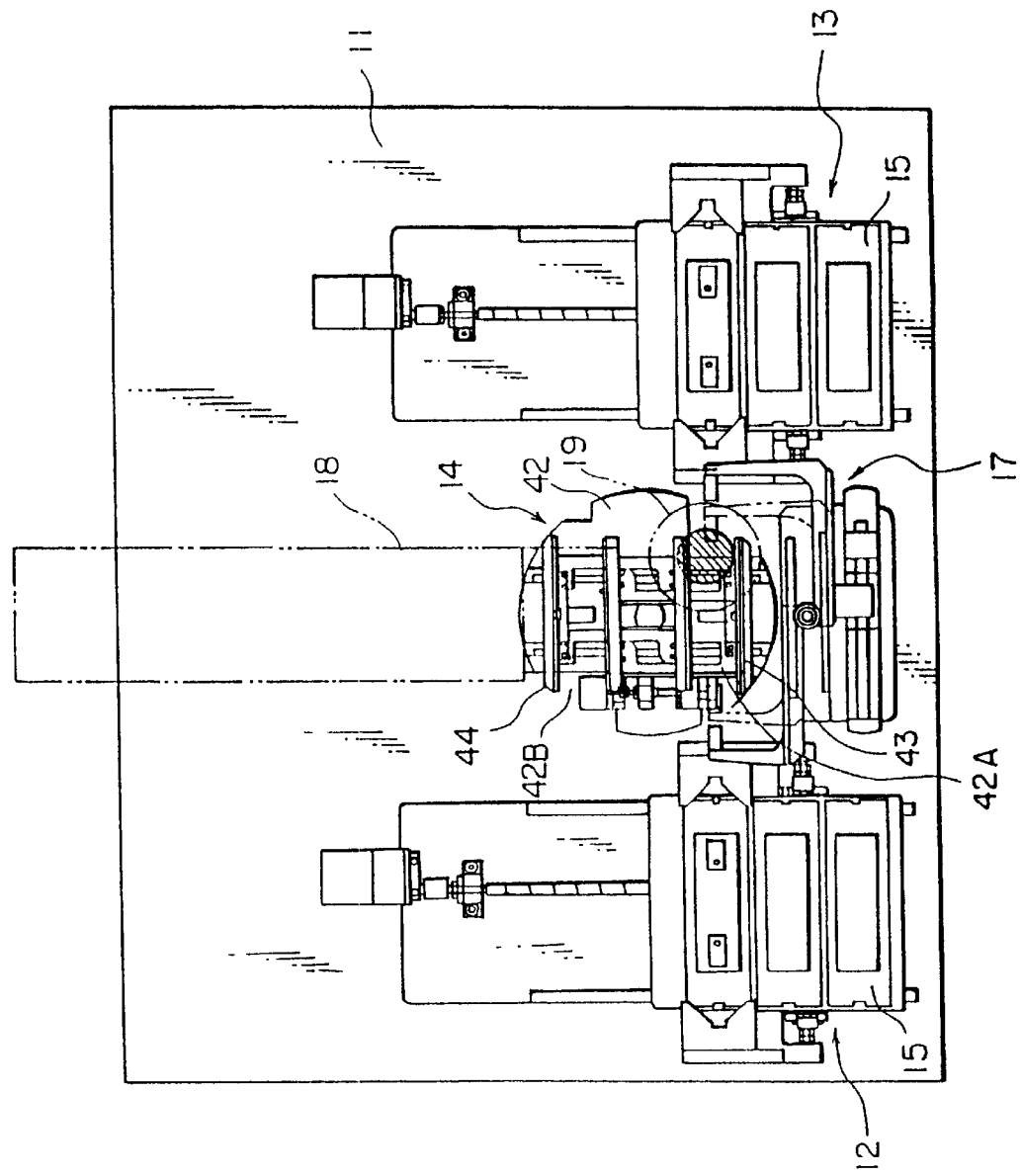
FIG. 2 is a plan view of an essential portion shown in FIG. 1.

FIG. 1 is a perspective view showing a laser marking apparatus having a lead frame transporting apparatus in accordance with a first embodiment of the present invention and FIG. 2 is a plan view of an essential portion shown in FIG. 1. In FIGS. 1 and 2, a supplying section 12 and a discharging section 13 which have similar structures are provided on a base 11. An index unit 14 is provided between the supplying section 12 and the discharging section 13. A plurality of magazines 15 which may receive a plurality of lead frames 21 (FIG. 3) are arranged on the supplying section 12 and the discharging section 13.

A transporting device 16 for transporting the lead frames 21, i.e., lead frame transporting apparatus, is provided above the supplying section 12, the discharging section 13 and the index unit 14. A frame positioning mechanism 17 for positioning the lead frame 21 on the index unit 14 in the longitudinal direction is provided in the vicinity of the index unit 14. A laser irradiating section (laser marker) 18 for performing the laser marking process on the lead frame 21 and an image detecting device 19 for detecting an image of the lead frame 21 are provided above the index unit 14. Incidentally, in FIG. 1, support members for the transporting device 16 and the image detecting device 19 at the base 11 are omitted.

A power source unit 20 for driving the laser irradiating section 18 is provided on the side of the base 11. A monitor 20A is provided on the power source unit 20. A controlling section 25 for controlling the equipment on the base 11 is provided within the base 11.

Figure 3:
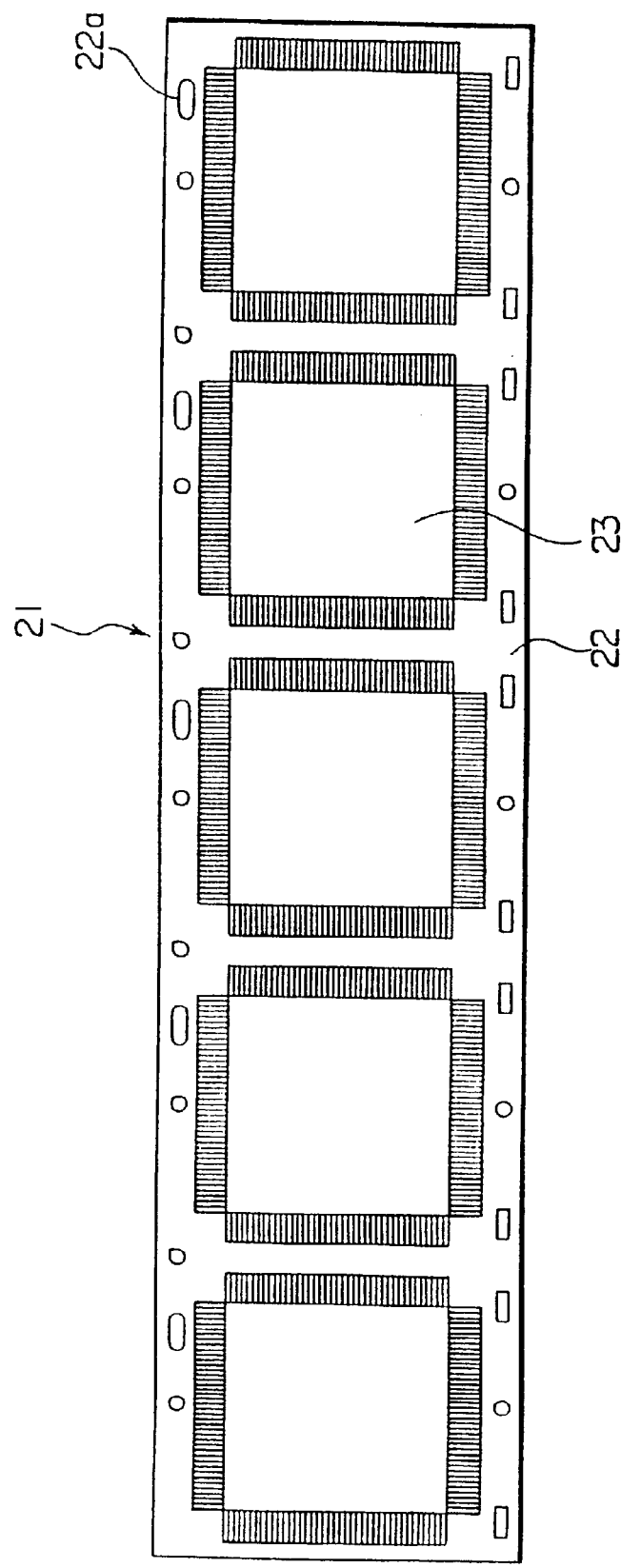
FIG. 3 is a plan view of one example of a lead frame to be processed in the apparatus shown in FIG. 1.

Next, FIG. 3 is a plan view showing one example of a lead frame 21 having package portions to be processed by the apparatus shown in FIG. 1. In FIG. 3, the lead frame 21 has a lead frame body 22 made of metal and a plurality of package portions 23 which are molded into the lead frame body 22. Elongated holes 22a used for detecting the top and bottom of the lead frame 21 are provided on the lead frame body 22.

Figure 4:
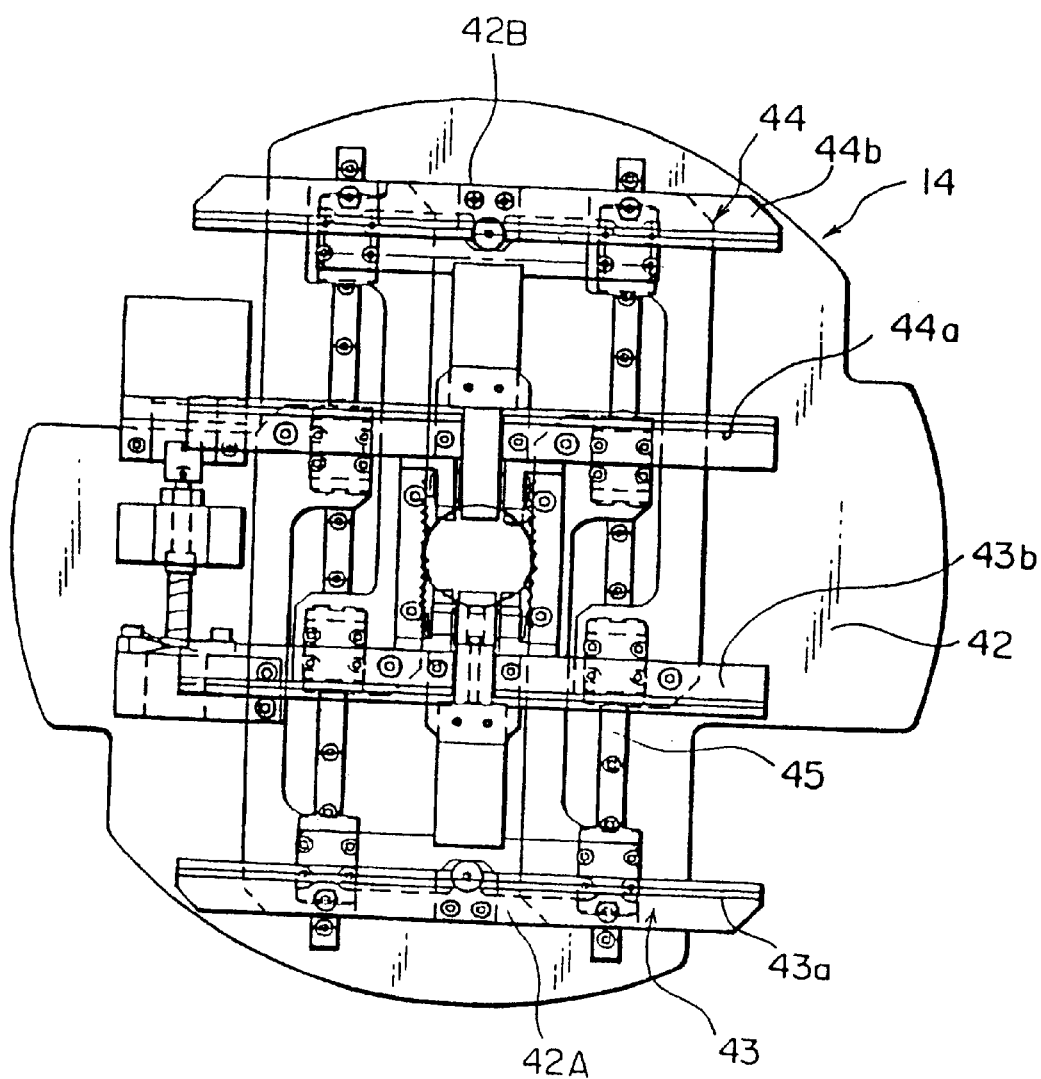
FIG. 4 is a plan view of the index unit shown in FIG. 1.
Figure 5:
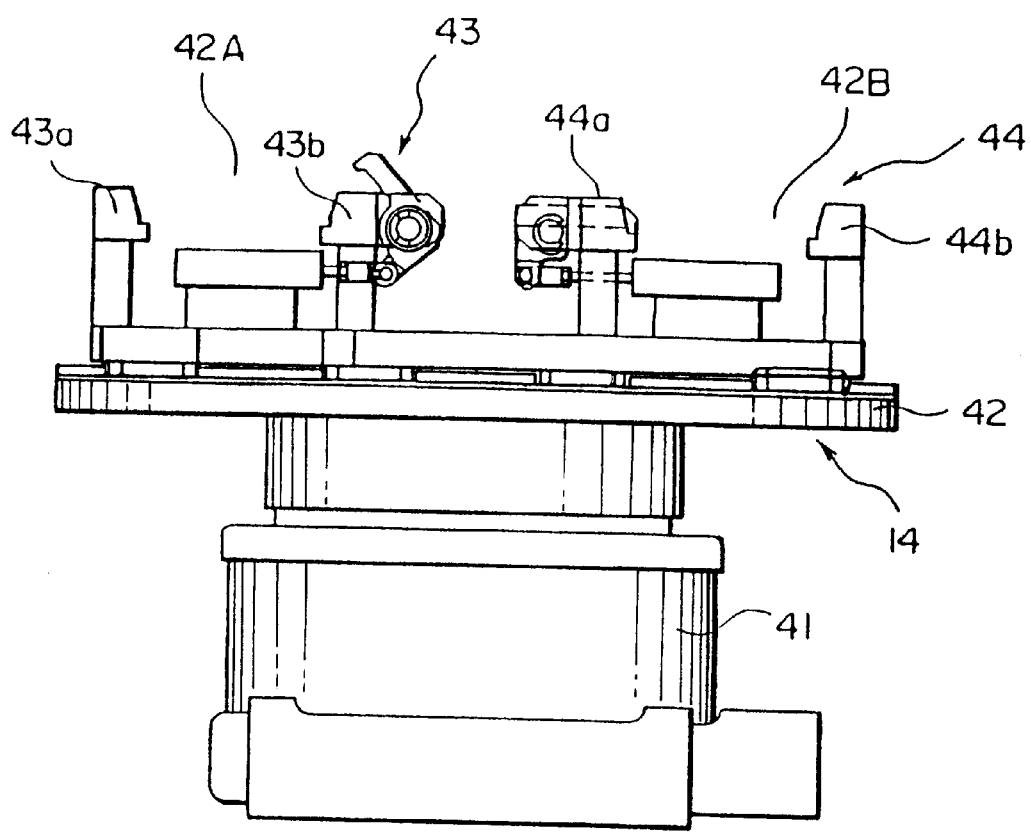
FIG. 5 is a front view of the index unit of FIG. 4 as viewed from the right.

Further, FIG. 4 is a plan view showing the index unit 14 shown in FIG. 1, and FIG. 5 is a front view of the index unit 14 of FIG. 4 as viewed from the right. In these drawings, the index unit 14 has a unit body 41 fixed to the base 11 and an index table 42 on a disc which is rotatably provided on the unit body 41. A first support portion 43 and a second support portion 44 for supporting the lead frame 21 are provided on the index table 42. The positions of the first and second support portions 43 and 44 may be alternated with each other between a stand-by position 42A and a processing position 42B by the rotation of the index table 42 through 180°.

The first and second support portions 43 and 44 have a pair of frame receivers 43a and 43b and a pair of frame receivers 44a and 44b, respectively. These frame receivers 43a, 43b, 44a and 44b are movable in the vertical direction in FIG. 4 (horizontal direction in FIG. 5) along a pair of guide rails 45, whereby it is possible to adjust the distance between the frame receivers 43a and 43b and the distance between the frame receivers 44a and 44b in response to the width of the lead frame 21.

Figure 6:
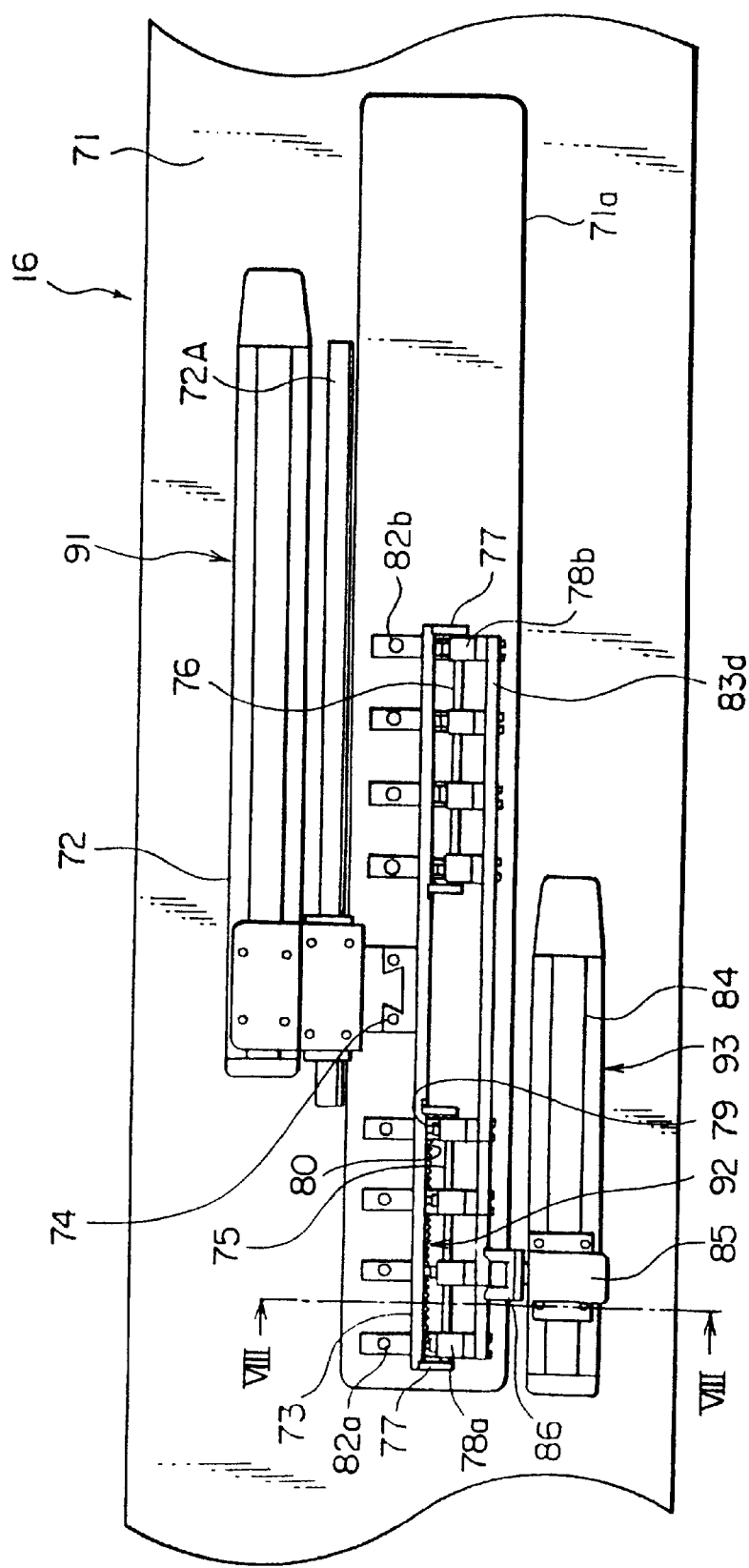
FIG. 6 is a plan view of the lead frame transporting apparatus shown in FIG. 1.
Figure 7:
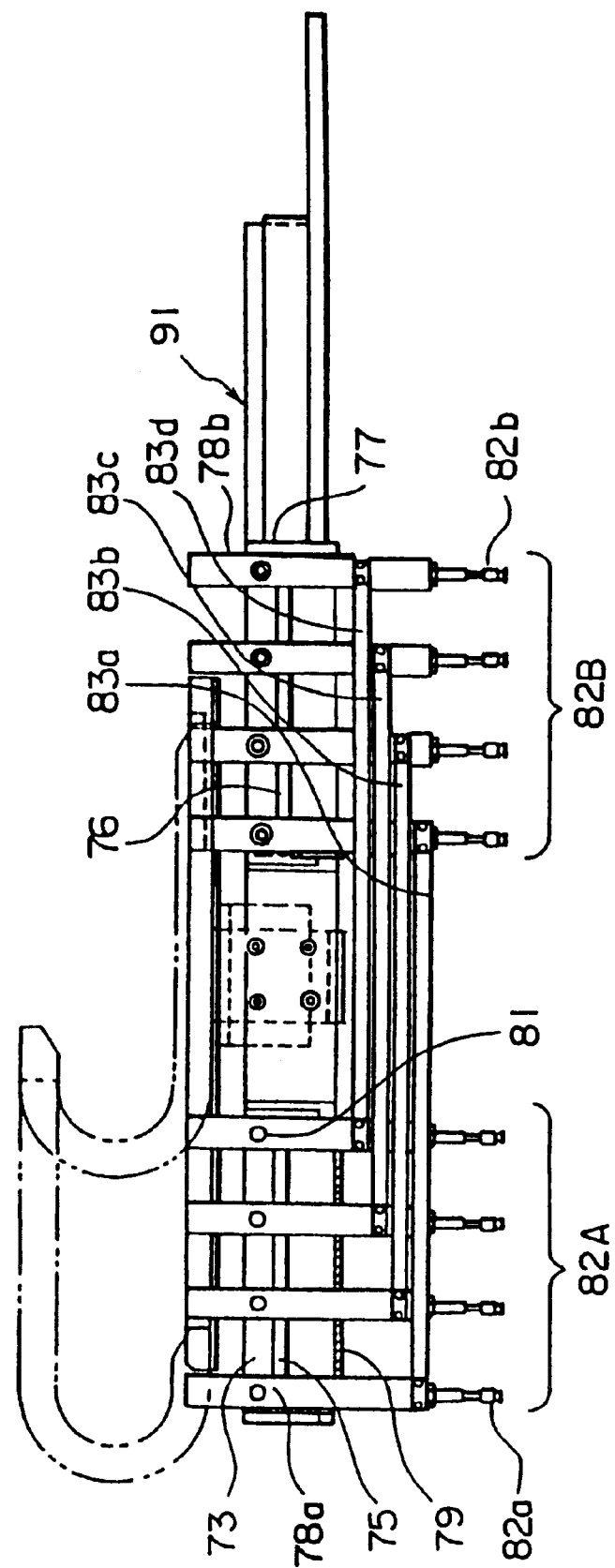
FIG. 7 is a front view of the essential portion shown in FIG. 6.
Figure 8:
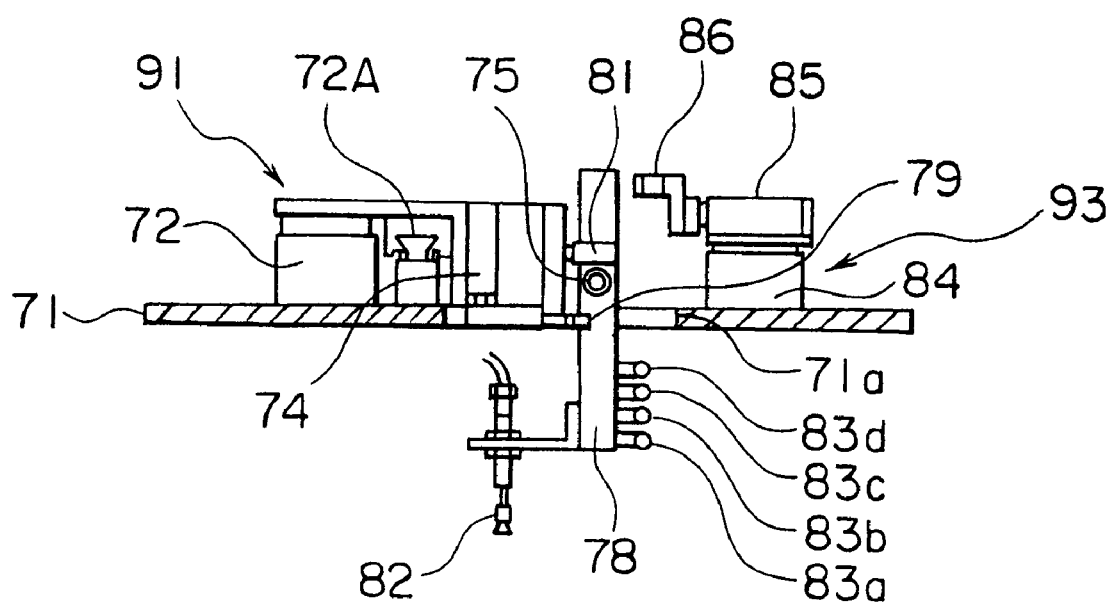
FIG. 8 is a cross-sectional view taken along the line VIII—VIII of FIG. 6.

Next, FIG. 6 is a plan view showing the lead frame transporting apparatus 16 shown in FIG. 1, FIG. 7 is a front view of the essential portions shown in FIG. 6, and FIG. 8 is a cross-sectional view taken along the line VIII—VIII of FIG. 6. In these drawings, a servo actuator 72 and a guide rail 72A are provided on a support plate 71. A frame conveyor plate 73 is reciprocated by the servo actuator 72 along the guide rail 72A in the horizontal direction in FIG. 6. A lifting air cylinder 74 for moving the frame conveyor plate 73 vertically is provided between the servo actuator 72 and the frame conveyor plate 73. A driving means 91 comprises the servo actuator 72 and the lifting air cylinder 74.

First and second slide shafts 75 and 76 are fixed to the frame conveyor plate 73 spaced from each other along the same axis. The slide shafts 75 and 76 are mounted on the frame conveyor plate 73 through a plurality of shaft support plates 77, respectively. Four first pad support members 78a passing through opening portion 71a of the support plate 71 are slidably mounted on the first slide shaft 75, and four second pad support members 78b passing through opening portion 71a are slidably mounted on the second slide shaft 76, respectively.

A pad-side rack 79 is provided on each first pad support member 78a, and these pad-side racks 79 are engaged with a pitch fixing rack 80 provided on the frame conveyor plate 73. Also, a ball plunger 81, used as a means for biasing the pad-side rack 79 toward the pitch fixing rack 80 by depressing the frame conveyor plate 73 is mounted on each first pad support member 78a. A sliding limit means 92 comprises the pad-side racks 79, the pitch fixing rack 80 and ball plungers 81.

A first suction pad 82a for lifting and holding the lead frame 21 is mounted on each first pad support member 78a. A second suction pad 82b for lifting and holding the lead frame 21 is mounted on each second pad support member 78b, respectively. Also, as shown in FIG. 7, a first suction pad group 82A is constituted by the four first suction pads 82a. In the same manner, a second suction pad group 82B is constituted by the four second suction pads 82b. The lead frame 21 is moved from the supplying section 12 to the stand-by position 42A by the first suction pad group 82A, and discharged from the stand-by position 42A to the discharging section 13 by the second suction pad group 82B.

The second pad support members 78b are connected to the first pad support members 78a located at corresponding positions through joint members 83a to 83d. For example, the leftmost second pad support member 78b is connected through the joint member 83a to the first pad support member 78a similarly located at the leftmost position. Accordingly, the suction pads 82a and 82b connected through the joint members 83a to 83d may always be slidably moved the same distance and in the same direction on the slide shafts 75 and 76.

A servo actuator 84 for shifting the pads is provided on the support plate 71. An air cylinder 85 is moved in the horizontal direction in FIG. 6 by the servo actuator 84 for shifting the pads. A holder 86 which engages with an upper end portion of the pad support member 78 is provided on the air cylinder 85. A pad moving mechanism 93 comprises the pad shifting servo actuator 84, the air cylinder 85 and the holder 86.

The overall operation of the apparatus will now be explained. A lead frame 21, accommodated in the magazine 15 of the supplying section 12 before a laser marking process, is held by suction by the transporting device 16, and transported to the stand-by position 42A on the index table 42, and the positioning thereof in the longitudinal direction is performed by the frame positioning mechanism 17. Thereafter, the lead frame 21 is held on the support portions 43 and 44. In this condition, the elongated holes 22a are detected by the image detecting device 19 to confirm the direction and the top and bottom of the lead frame 21. The lead pitch is also detected by the image detecting device 19 to confirm the type of lead frame 21.

After image detection by the image detecting device 19, the lead frame 21 before the laser marking process is moved to the processing position 42B by rotating the index table 42 through 180°, and all the package portions 23 are subjected to the laser marking process by the laser irradiating section 18. After the process, the index table 42 is reversed through 180°, and the lead frame 21 is moved to the stand-by position 42A. Then, the presence of the mark is detected by the image detecting device 19. Incidentally, when an abnormality is detected in the image detection before or after the process, an error is displayed on the monitor 20A and the operation of the apparatus is stopped.

Thereafter, the laser marked lead frame 21 is transported into the magazine 15 of the discharging section 13 by the suction pad group 82B of the transporting device 16. Simultaneous with this, the next lead frame 21 from the supplying section 12 is transported to the stand-by position 42A by the suction pad group 82A of the same transporting device 16.

Also, when the intervals of the suction pads 82a and 82b are to be changed in accordance with a change in the type of lead frames 21, the holder 86 is moved upwardly (in FIG. 6) by the air cylinder 85 and engaged with the first pad support members 78a. The first pad support member 78a is pressed by the holder 86 and rotated against the action of the ball plunger 81, and consequently, the pad-side rack 79 is disengaged from the pitch fixing rack 80. In this condition, the air cylinder 85 is moved by the pad shifting servo actuator 84 so that the first pad support members 78a are slidably moved along the slide shaft 75.

After the first pad support members 78a have been slidably moved to a predetermined position, the holder 86 is retracted so that the pad-side rack 79 reengages with the pitch fixing rack 80 and the positions of the first pad support members 78 in the axial direction of the slide shaft 75 are fixed. Thus, the intervals of the first suction pads 82a are adjusted in order. As a result, the intervals of the second suction pads 82b are automatically adjusted in order. Such an interval adjusting operation of the suction pads 82a and 82b is automatically performed based on information which is stored in advance by inputting information concerning the type of the lead frame 21 into the controlling section 25.

According to the above-described lead frame transporting apparatus 16, it is possible to perform the positional adjustment of the suction pads 82a and 82b in accordance with the type of the lead frames 21 in a short period of time, and yet with a high precision. Also, since the second pad support members 78b corresponding to the first pad support members 78a are connected to each other by the joint members 83a to 83d, the positions of the second pad support members 78b can be automatically adjusted by only adjusting the positions of the first pad support members 78a, and it is possible to perform the adjustment operation in a short period of time and reduce the size of the pad moving mechanism 93.

Incidentally, although in the foregoing example, the slide limiting means 92 is shown comprising the pad-side rack 79 and the pitch fixing rack 80, the invention is not limited thereto. For instance, it is possible to grip the leads using a frictional member or a magnet, for example.

Also, in the foregoing example, the slide limiting means 92 is provided only for the first pad support members 78a. It is however possible to provide the slide limiting means 92 for both the first and second pad support members 78a and 78b.

Furthermore, the number of the respective suction pads 82a and 82b is not limited to the number in the foregoing embodiment.

Furthermore, although the lead frame transporting apparatus 16 is provided in the laser marking apparatus in the foregoing example, it may also be applied to other apparatus as well.

Second Embodiment

Figure 9:
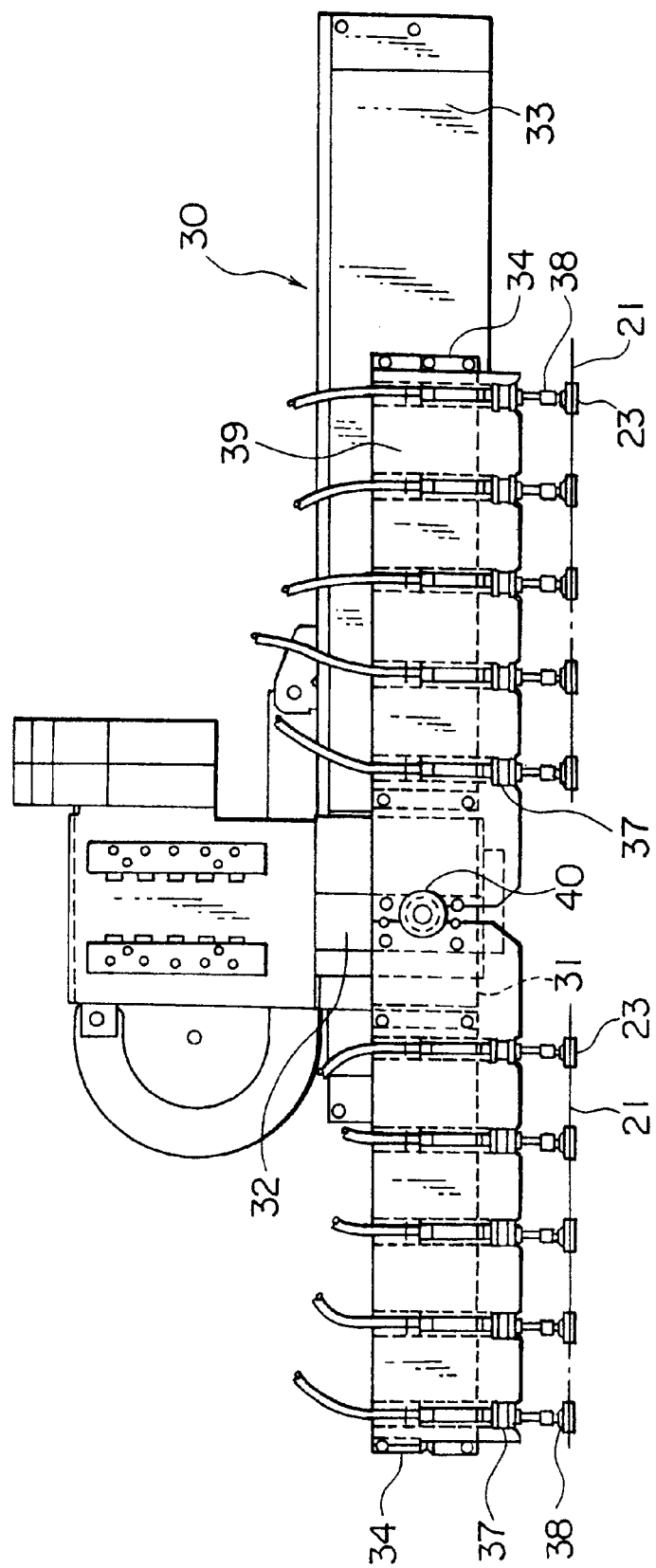
FIG. 9 is a front view showing a lead frame transporting apparatus according to a second embodiment of the invention.
Figure 10:
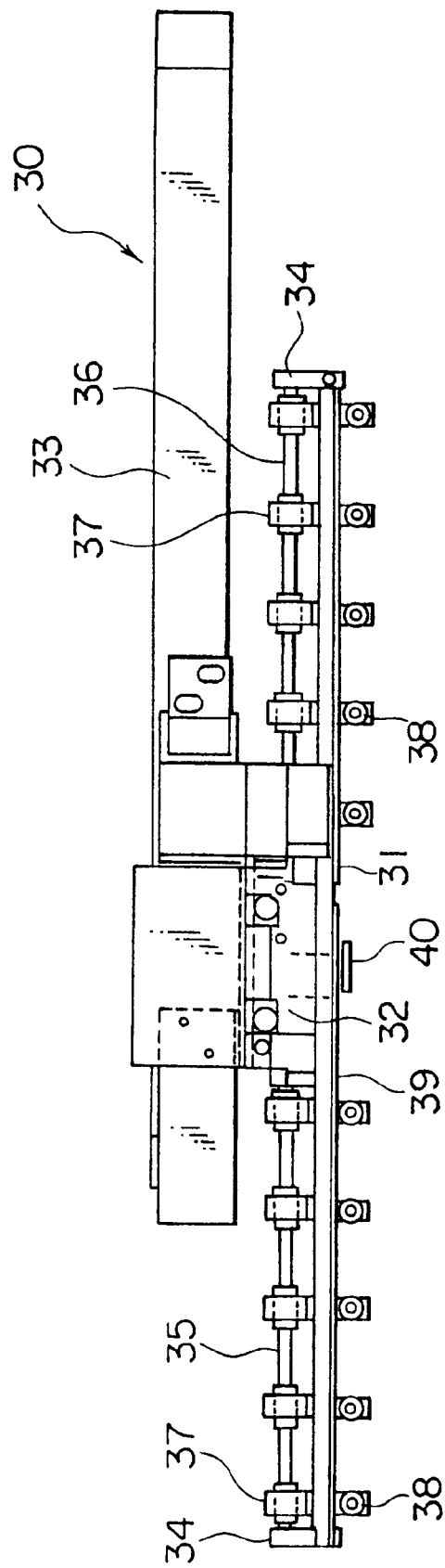
FIG. 10 is a front view of FIG. 9.
Figure 11:
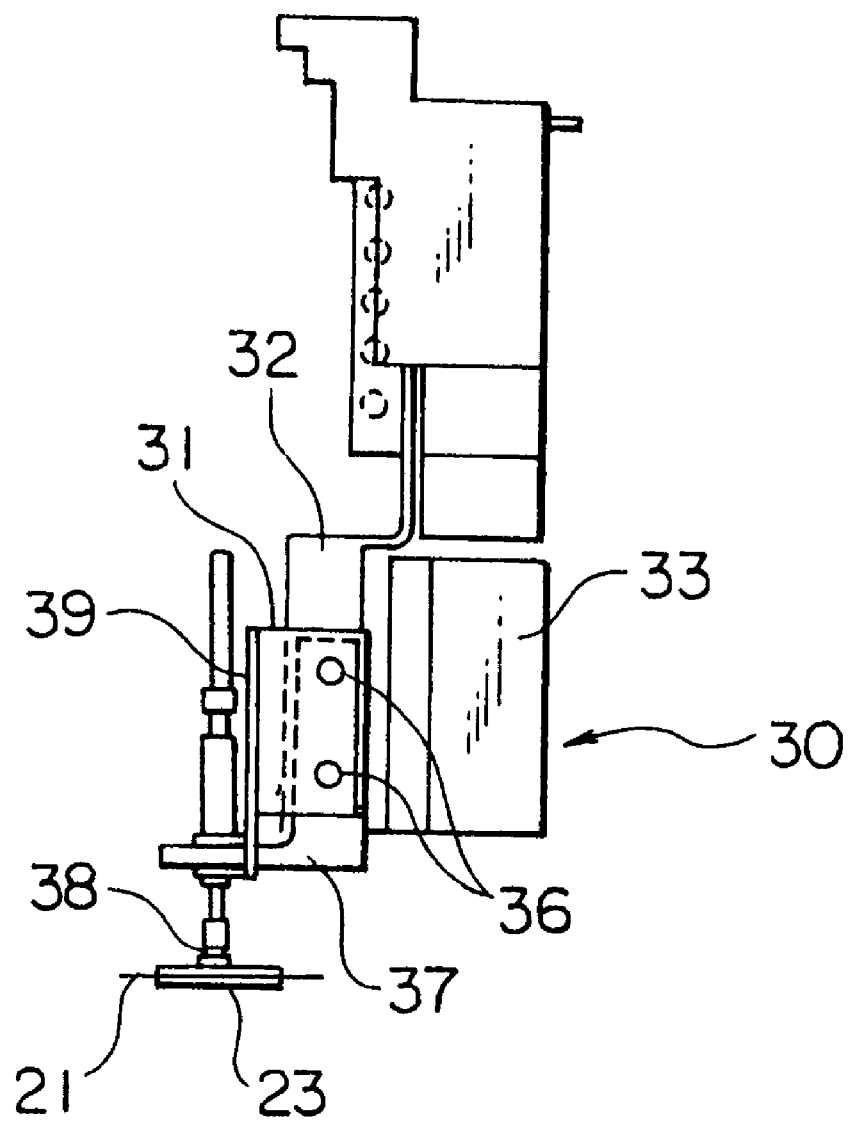
FIG. 11 is a right side elevational view of FIG. 9.

Next, FIG. 9 is a front view showing a lead frame transporting apparatus according to a second embodiment of the invention, FIG. 10 is a front view of FIG. 9, and FIG. 11 is a right side elevational view of FIG. 9. In these drawings, a frame conveyor plate 31 is moved vertically by a lifting air cylinder 32, and moved horizontally in FIG. 10 by an air slide mechanism 33. A driving means 30 comprises the lifting air cylinder 32 and the air slide mechanism 33. A pair of first slide shafts 35 and a pair of second slide shafts 36 are mounted on the frame conveyor plate 31 through shaft support plates 34.

Five pad support members 37 are slidably mounted on the first and second slide shafts 35 and 36, respectively. Suction pads 38 for lifting the package portions 23 of the lead frames 21 are mounted on the respective pad support members 37.

Figure 12:
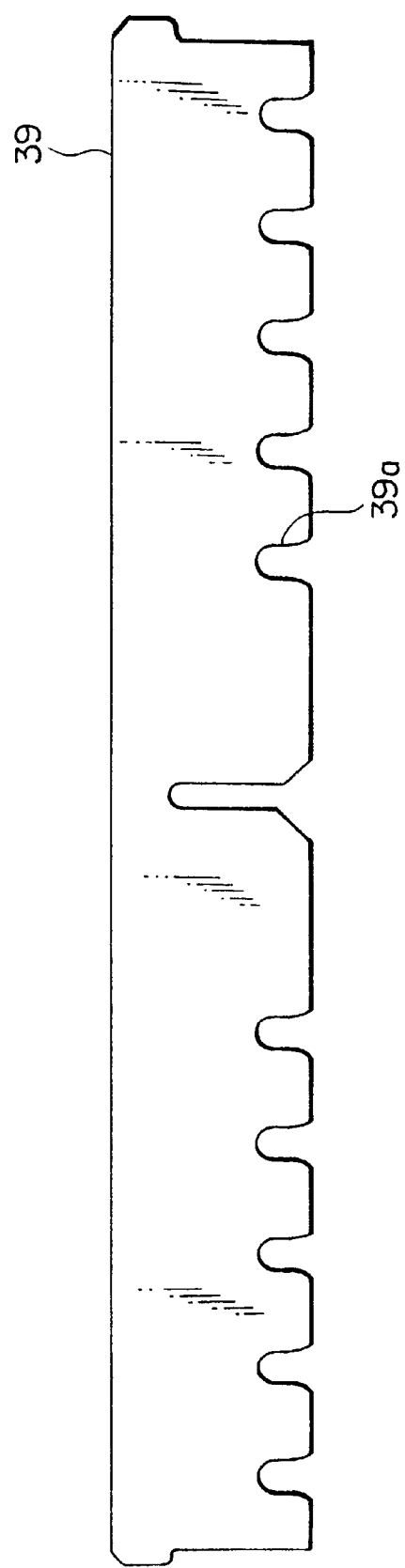
FIG. 12 is a front view of the positioning plate shown in FIG. 9.
Figure 13:
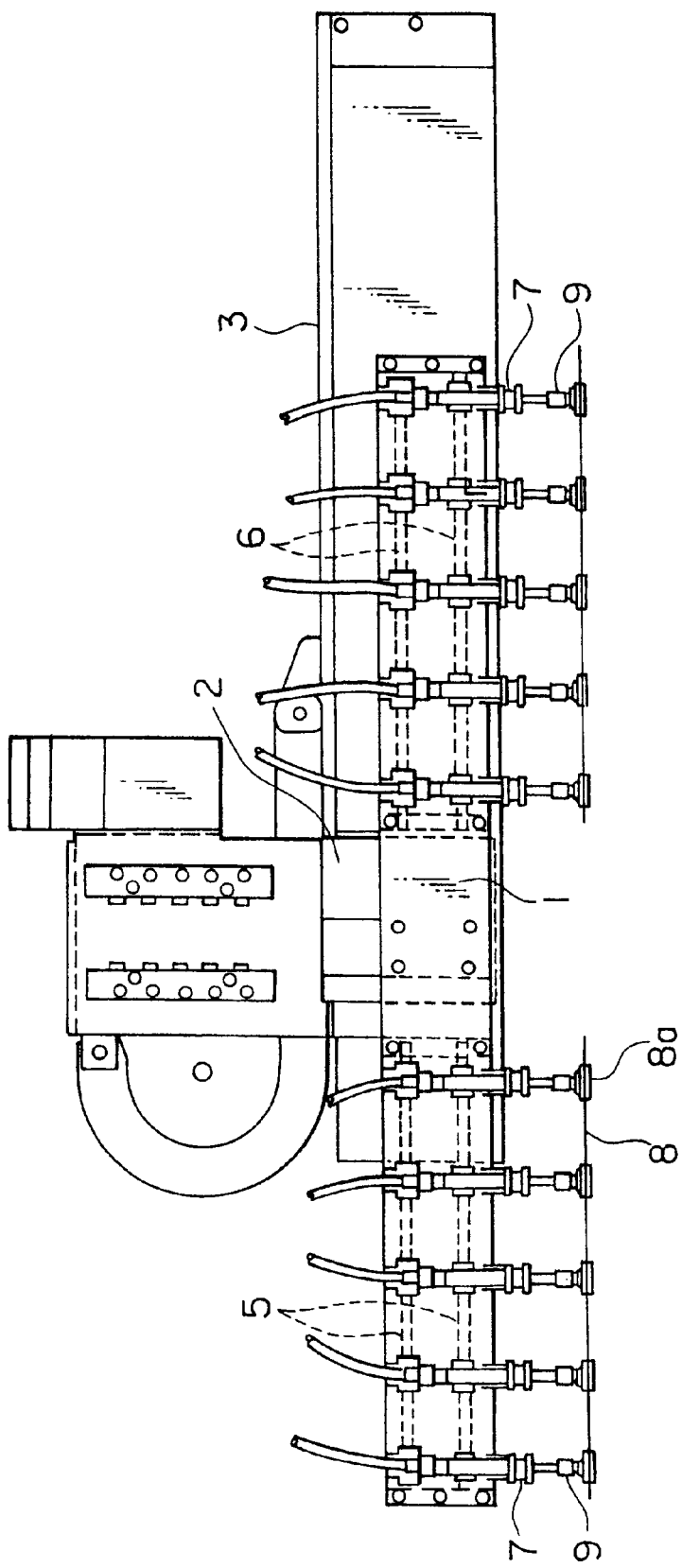
FIG. 13 is a perspective view showing an example of a conventional laser marking apparatus.
Figure 14:
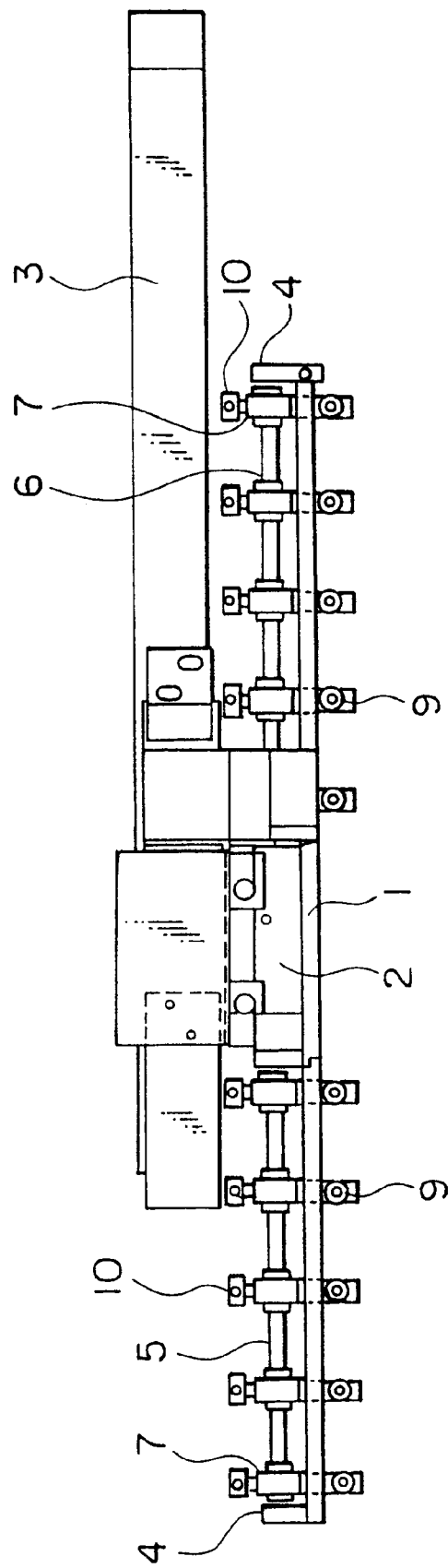
FIG. 14 is a plan view of the apparatus shown in FIG. 13.
Figure 15:
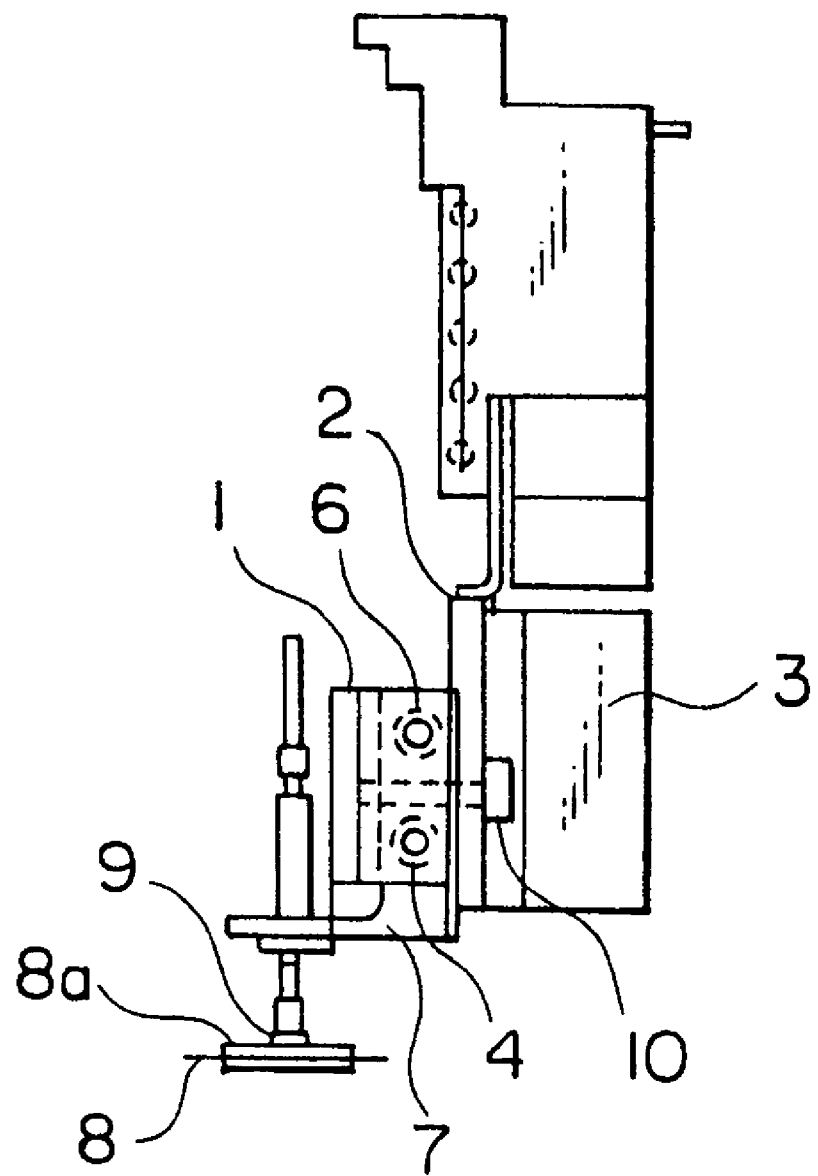
FIG. 15 is a side elevational view of the apparatus shown in FIG. 13.

A positioning plate (template) 39 is mounted on a front face of the frame conveyor plate 31 by fastening screws 40. As shown in FIG. 12, a plurality of grooves 39a into which a part of each pad support member 37 is inserted are provided in the positioning plate 39. A plurality of positioning plates 39, each of which is the same as described above, are prepared, and the positions of the grooves 39a of each positioning plate 39 are different from each other depending on the type of lead frame 21. Besides the transporting apparatus, the structure is the same as that of the first embodiment.

In such a lead frame transporting apparatus, when the intervals of the suction pads 38 are changed in accordance with a change in the type of lead frame 21, the fastening screws 40 are loosened to remove the positioning plates 39. Thereafter, other positioning plates 39 corresponding to the new type of lead frame 21 are mounted on the front face of the frame conveyor plate 31 and, at the same time, the pad support members 37 are inserted into the grooves 39a. Then, the fastening screws 40 are fastened. Thus, it is possible to adjust the positions of the suction pads 38 readily in a short period of time.

Various details of the invention may be changed without departing from its spirit and scope. Furthermore, the foregoing description of the embodiments according to the present invention is provided for the purpose of illustration only, and not for the purpose of limiting the invention as defined by the appended claims and their equivalents.

What is claimed is:

1. A lead frame transporting apparatus for transporting lead frames on which a plurality of package portions are located, comprising:

a frame conveyor plate;

driving means for driving said frame conveyor plate vertically and horizontally;

slide shafts on said frame conveyor plate;

a plurality of pad support members mounted slidably on said slide shafts, respectively;

a plurality of suction pads mounted on respective pad support members for holding the package portions with suction;

slide limiting means on said frame conveyor plate for limiting sliding of said pad support members, said slide limiting means comprising:

a pitching fixing rack on said frame conveyor plate;

a plurality of pad-side racks on said pad support members, each pad-side rack engaging said pitch fixing rack; and a plurality of biasing means on said pad support members for biasing said pad support members in a direction to engage said pad-side racks with said pitch fixing racks, wherein said pad support members are rotated about said slide shafts so that said pad-side racks are disengaged from said pitch fixing racks against resistance produced by said biasing means;

a pad moving mechanism for releasing said slide limiting means and moving said pad support members along said slide shaft; and a controlling section for controlling said pad moving mechanism according to lead frame information input thereto to automatically adjust positions all of said pad support members.

2. A lead frame transporting apparatus for transporting lend frames on which a plurality of package portions are located, comprising:

a frame conveyor plate;

driving means for driving said frame conveyor plate vertically and horizontally;

slide shafts on said frame conveyor plate;

a plurality of pad support members mounted slidably on said slide shafts, respectively;

a plurality of suction pads mounted on respective pad support members for holding the package portions with suction;

slide limiting means on said frame conveyor plate for limiting sliding of said pad support members;

a pad moving mechanism for releasing said slide limiting means and moving said pad support members along said slide shafts, said pad moving mechanism comprising:

a pad shifting servo actuator;

an air cylinder moved parallel to said slide shafts by said pad shifting servo actuator; and a holder moved substantially perpendicular to said slide shafts between forward and rearward positions by said air cylinder and engaging one of said pad support members at the forward position for moving said pad support member along said slide shaft and disengaging from said pad support members at the rearward position; and a controlling section for controlling said pad moving mechanism according to lead frame information input thereto to automatically adjust positions all of said pad support members.

3. A lead frame transporting apparatus for transporting lead frames on which a plurality of package portions are located, comprising:

a frame conveyor plate;

driving means for driving said frame conveyor plate vertically and horizontally;

first and second slide shafts spaced at intervals from each other along a common axis and mounted on said frame conveyor plate;

a plurality of pad support members including first pad support members mounted slidably on said first slide shaft and second pad support members mounted slidably on said second slide shaft, wherein each of said second pad support members is connected to a respective first support member at a corresponding position through a joint member;

a plurality of suction pads mounted on respective pad support members for holding the package portions with suction;

slide limiting means on said frame conveyor plate for limiting sliding of said pad support members;

a pad moving mechanism for releasing said slide limiting means and moving said pad support members along said slide shafts; and a controlling section for controlling said pad moving mechanism according to lead frame information input thereto to automatically adjust positions all of said pad support members.

\* \* \* \* \*